United States Patent
Bramante et al.

(10) Patent No.: US 7,791,380 B2
(45) Date of Patent: Sep. 7, 2010

(54) CURRENT SAMPLING METHOD AND CIRCUIT

(75) Inventors: Nicola Bramante, Willingham (GB);
Martin John Edwards, Crawley (GB);
John Richard Ayres, Reigate (GB)

(73) Assignee: TPO Displays Corp., Chu-Nan, Miao-Li County (TW)

( * ) Notice: Subject to any disclaimer, the term of this patent is extended or adjusted under 35 U.S.C. 154(b) by 120 days.

(21) Appl. No.: 12/337,149

(22) Filed: Dec. 17, 2008

(65) Prior Publication Data
US 2009/0167364 A1     Jul. 2, 2009

Related U.S. Application Data

(60) Provisional application No. 61/016,602, filed on Dec. 26, 2007.

(30) Foreign Application Priority Data

Sep. 17, 2008   (EP)  .................................. 08165429

(51) Int. Cl.
*H03K 5/00*   (2006.01)
(52) U.S. Cl. .......................................... 327/94; 327/91
(58) Field of Classification Search .............. 327/91–96
See application file for complete search history.

(56) References Cited

U.S. PATENT DOCUMENTS

| | | | | |
|---|---|---|---|---|
| 5,227,676 A | * | 7/1993 | Bahr et al. | 327/94 |
| 5,760,616 A | * | 6/1998 | Vallancourt | 327/91 |
| 6,943,593 B2 | * | 9/2005 | Draxelmayr | 327/94 |
| 7,696,792 B2 | * | 4/2010 | Hsu | 327/94 |

FOREIGN PATENT DOCUMENTS

JP            2003234962        8/2003

* cited by examiner

*Primary Examiner*—Hai L Nguyen
(74) *Attorney, Agent, or Firm*—Morris, Manning & Martin LLP; Tim Tingkang Xia

(57) ABSTRACT

A current sampling circuit including a current sampling transistor, a capacitor arrangement between the gate and source of the current sampling transistor and an amplifier provided in a feedback loop between the gate and source of the current sampling transistor. A switch controls the circuit to sample a gate-source voltage corresponding to a current being sampled onto the capacitor arrangement. The capacitor arrangement comprises a first capacitor circuit for sampling a gate source voltage in a first sampling phase and a second capacitor circuit, with the first and second capacitor circuits arranged for together sampling the gate source voltage in a second sampling phase. The operating point of the amplifier is shifted between the first and second phases based on the gate source voltage sampled in the first sampling phase.

17 Claims, 7 Drawing Sheets

CURRENT SAMPLING METHOD AND CIRCUIT

CROSS REFERENCE TO RELATED APPLICATIONS

This application claims the benefit of U.S. Provisional Application No. 61/016,602, filed Dec. 26, 2007, the entirety of which is incorporated by reference herein.

This Application claims priority of European Patent Application No. 08165429.3, filed on Sep. 17, 2008, the entirety of which is incorporated by reference herein.

BACKGROUND OF THE INVENTION

1. Field of the Invention

This invention relates to current sampling methods and circuits, particularly but not exclusively for capturing output signals from sensors which have a current output.

2. Description of the Related Art

In a number of sensing applications, the sensing devices (for example diodes or transistors) generate an output current which depends on the parameter to be sensed. The range of applications in which current sensors can be used is enormous, and this invention can be applied to any such application. For example, the parameter to be sensed can be a light level in the case of a photosensor or a temperature in the case of a temperature sensor. The sensor will measure a physical property such as light, temperature, strain or other forces.

The output current of a sensor will often be very small, and it is advantageous to convert the signal to a more robust form close to the sensor in order to preserve the quality of the signal, particularly the signal to noise ratio. Sampling of the current is required in the case where the signal changes over time or when the output of several sensors is multiplexed together as is the case for an array of sensors.

Conventional current sampling circuits can be slow to acquire new signals, particularly when the currents are small.

FIG. 1 shows a known simple sampling circuit. The current to be sampled may for example comprise a photocurrent, and is represented by a current source 10. The current is drawn through a p-type drive transistor T1$p$, which has a capacitor C1 connected between its source and gate. This capacitor can thus store the gate-source voltage corresponding to the current being sampled.

The circuit has a first switch S1 (with timing clk1) between the gate and drain of the transistor T1$p$ for turning the transistor on so that it can supply the current being sampled. A second switch S2 (with timing clk2) couples the transistor T1$p$ to the sensor, and a third switch S3 (with timing clk3) couples the transistor T1$p$ to the output of the sampling circuit.

As shown in FIG. 2, during a sampling phase S the switches S1 and S2 are closed and the switch S3 is open. The current to be sampled, the photocurrent in this example, is drawn through the transistor T1$p$. The voltage present on the gate and the drain of T1$p$ settles at a value which produces a drain current in T1$p$ which is equal to the photocurrent. This voltage becomes stored across the capacitor C1. During a holding phase H the switches S1 and S2 are opened and the switch S3 is closed. The gate-source voltage of T1$p$ is maintained by C1 and therefore the sampled photocurrent is available at the output of the circuit.

The time required to sample the current is proportional to $(C1+Cd)/gm1$ where Cd is the capacitance of the sensor (i.e. the photodiode) and gm1 is the transconductance of the transistor T1$p$. When the current to be measured is small, the transistor T1$p$ will be operating in the sub-threshold region. In this region, the value of gm1 is proportional to the drain current Id1. Therefore when the current to be sampled is low the settling time is extended.

The settling time can be reduced using the circuit shown in FIG. 3.

The p-type transistor T1$p$ is replaced by an n-type transistor T1$n$ and an inverting amplifier 20 is connected between the source of the transistor T1$n$ and the gate. The storage capacitor C1 is again between the source and gate, as the n-type transistor has its drain connected to the high voltage line VDD. With this arrangement, the settling time is now proportional to $(C1+Cd)/(A \cdot gm1)$, where A is the gain of the inverting amplifier 20. This reduces the settling time of the circuit by increasing the effective value of the transconductance of T1$n$.

A switch S4 (with timing clk4) opens or closes the amplifier feedback loop, and a switch S5 (with timing clk5) can reset the amplifier.

As shown in FIG. 4, during the sampling phase S the switches S2 and S4 are closed, while the S3 and S5 are open, so that the gate of T1 sees an amplified version of the voltage at its source. The gate source voltage Vgs of T1$n$ required to produce a drain current equal to the photocurrent gets stored across C1. During the holding phase H the switches S4 and S2 are open, whereas S3 and S5 are closed. T1$n$ provides the sampled current as output of the circuit. The amplifier sits around its threshold with its input and output connected together, thus ensuring that the voltage node associated with the sensor (in this example the cathode of the photodiode) is kept fairly constant.

The capacitor C1 in FIG. 3 is connected between the input and the output of the inverting amplifier 20 during the sampling phase S. Due to the Miller effect, the effective value of C1 is increased, since the inverting amplifier 20 sees an equivalent capacitance A.C1 between its input and ground. This equivalent capacitor is in parallel with Cd and tends to make the circuit slow.

The circuit in FIG. 3 is also limited by the current that needs to be sampled. That current fixes a gate source voltage for T1$n$ that needs to be built up on the storage capacitor C1. When sampling for example 350 pA, the gate source voltage needed is approximately 700 mV, which corresponds to a particular operating point of the inverting amplifier.

FIG. 5 shows a plot of the gain of an inverting amplifier as a function of Vout-Vin, which in the sampling phase is the gate source voltage of T1$n$. It can be seen that the operating point of the inverting amplifier, set by the gate source voltage of T1$n$, will be different from the voltage at which the gain is maximum (in absolute value). In other words, the amplifier 20 is not biased to its optimum operating point. This shows a fundamental limitation of the approach shown in FIG. 3.

BRIEF SUMMARY OF THE INVENTION

According to the invention, there is provided a current sampling circuit, comprising a current sampling transistor, a capacitor arrangement, an amplifier, and a switch arrangement. The capacitor arrangement is between the gate and source of the current sampling transistor, for storing a gate-source voltage corresponding to a current being sampled. The amplifier is provided in a feedback loop between the gate and source of the current sampling transistor. The switch arrangement controls the circuit to sample a gate-source voltage corresponding to a current being sampled onto the capacitor arrangement. The capacitor arrangement comprises a first capacitor circuit for sampling a gate source voltage in a first sampling phase and a second capacitor circuit, with the first and second capacitor circuits being arranged for together sampling the gate source voltage in a second sampling phase. The switch arrangement is operable to shift the operating point of the amplifier between the first and second phases based on the gate source voltage sampled in the first sampling phase.

This arrangement provides a coarse sampling phase, which is used to change the operating conditions of an amplifier used within the circuit, in particular by changing the desired voltage at the output. This means the amplifier can operate more efficiently in a subsequent fine tuning sampling phase.

The switch arrangement can comprise a switch for selecting if the first capacitor circuit is connected between the source and gate of the current sampling transistor for the first phase, or if the first and second capacitor circuits are between the source and gate of the current sampling transistor for the second phase. Thus, each phase uses a different circuit configuration in respect of the capacitors of the capacitor arrangement.

The switch arrangement can comprise a first amplifier output switch for connecting the output of the amplifier to the gate of the current sampling transistor for the first phase and a second amplifier output switch for connecting the output of the amplifier to the junction between the first and second capacitor circuits in the second phase. In this way, the desired voltage at the amplifier output can be changed to change the amplifier operating conditions.

A reset phase is preferably provided between the first and second phases in which the amplifier input and output are connected together.

One of the first and second capacitor circuits can comprise a first and second capacitor in series. By connecting a junction between the first and second capacitors to a reference potential during a sampling phase, the Miller effect explained above can be avoided.

The invention also provides a current sampling circuit, comprising a current sampling transistor, a capacitor, an amplifier, and a switch arrangement. The capacitor arrangement is between the gate and source of the current sampling transistor, for storing a gate-source voltage corresponding to a current being sampled. The amplifier is provided in a feedback loop between the gate and source of the current sampling transistor. The switch arrangement controls the circuit to sample a gate-source voltage corresponding to a current being sampled onto the capacitor arrangement. The capacitor arrangement comprises a first and second capacitor in series, and wherein the switching arrangement comprises a switch for connecting a junction between the first and second capacitors to a reference potential. This current sampling circuit overcomes the Miller effect. The current sampling circuit of the invention can be used as part of a sensor circuit, in which a sensor has a current output which is the current to be sampled.

The invention also provides a current sampling method. An exemplary embodiment of a current sampling method is described in the following. In a first sampling phase, an amplifier is using to amplify a source voltage of a current sampling transistor, the amplified voltage is provided to the gate, the gate source voltage corresponding to a current being sampled onto a first capacitor circuit is sampled, and the sampled gate source voltage is used to shift the operating point of the amplifier. In a second sampling phase, an amplifier is used to amplifying a source voltage of the current sampling transistor, the amplified voltage is provided to the gate, and the gate source voltage corresponding to a current being sampled onto a capacitor arrangement is sampled. The capacitor arrangement comprises a first capacitor circuit and a second capacitor circuit.

The invention also provides a current sampling method. An exemplary embodiment of a current sampling method is described in the following. In a sample phase, an amplifier is used to amplify a source voltage of a current sampling transistor, the amplified voltage is provided to the gate, and the gate source voltage corresponding to a current being sampled onto a capacitor circuit is sampled. The capacitor circuit comprises a first and second capacitor in series, wherein during the sampling, a junction between the first and second capacitors is connected to a reference potential.

In a hold phase, the sampled current is provided as an output, and the junction between the first and second capacitors from the reference potential is isolated.

These methods correspond to the use of the circuits of the invention. The sampling methods can be used as part of a signal sensing method, in which a sensor is used to perform a sensing function, thereby generating a current output which is sampled by the sampling methods of the invention.

The invention thus provides circuits and methods in which provide two approaches. The first is a way of eliminating the Miller effect, present during the sampling phase. This method is based on splitting the capacitance being increased by the Miller effect into two series capacitors and on connecting their common terminal to a reference potential, such as ground.

The second is a two step sampling approach. In a first sampling phase, a coarse gate source voltage value is stored across a capacitor and is used to shift the operating point of the inverting amplifier in a second sampling phase. In this way, during the second sampling phase the inverting amplifier will operate around its high gain region, thus giving shorter sampling times and good immunity to changes of transistor characteristics. The two approaches can be combined in one circuit/method.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein:

FIG. 6b is a timing diagram for the circuit of FIG. 6a;
FIG. 7b is a timing diagram for the circuit of FIG. 7a;
FIG. 8b is a timing diagram for the circuit of FIG. 8a.

DETAILED DESCRIPTION OF THE INVENTION

Figure 1:
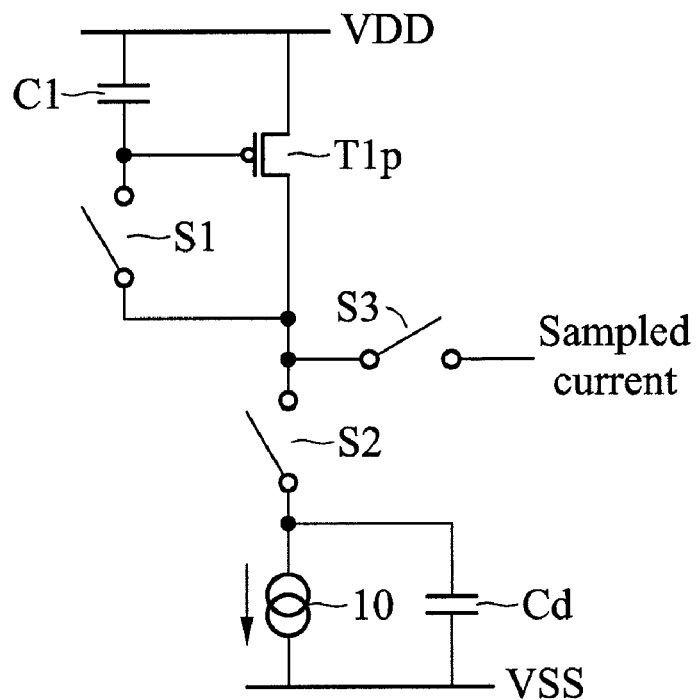
FIG. 1 shows a first known current sampling circuit.
Figure 2:
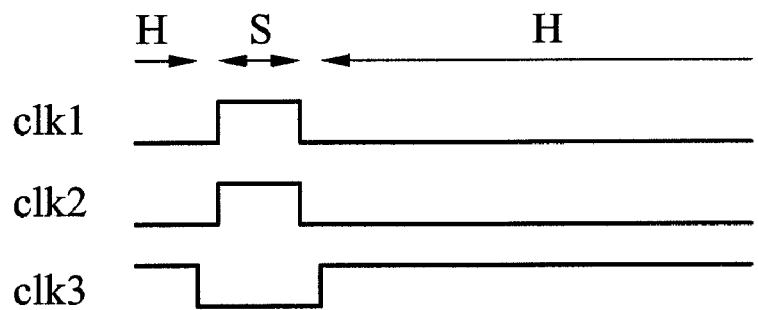
FIG. 2 is a timing diagram for the circuit of FIG. 1.

The following description is of the best-contemplated mode of carrying out the invention. This description is made for the purpose of illustrating the general principles of the invention and should not be taken in a limiting sense. The scope of the invention is best determined by reference to the appended claims.

The same reference numerals have been used in different figures where the components perform the same function as in other figures. Description of the function of each component is therefore not repeated.

The invention provides solutions to the two problems outlined above, namely the Miller effect capacitance issue and the amplifier operating point issue. Sensor circuits are described below which address these issues individually and a circuit is described with addresses both issues.

Figure 3:
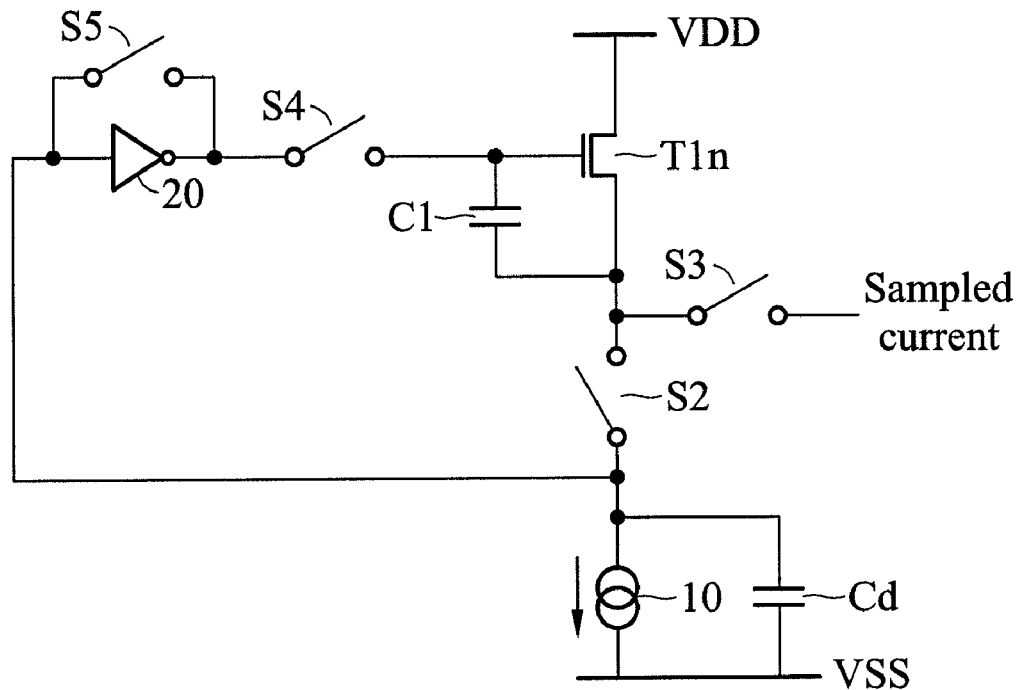
FIG. 3 shows a second known current sampling circuit.
Figure 4:
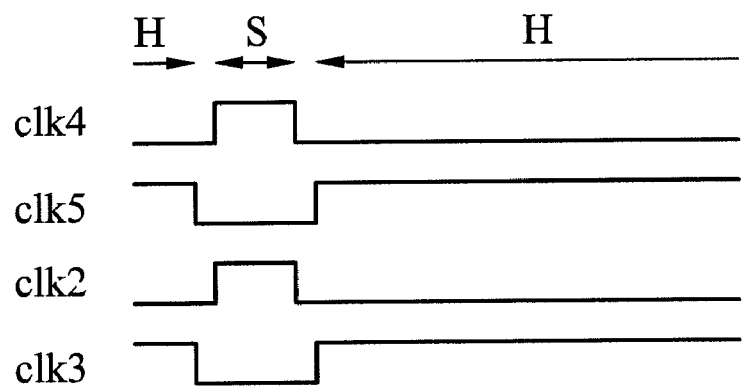
FIG. 4 is a timing diagram for the circuit of FIG. 3.
Figure 5:
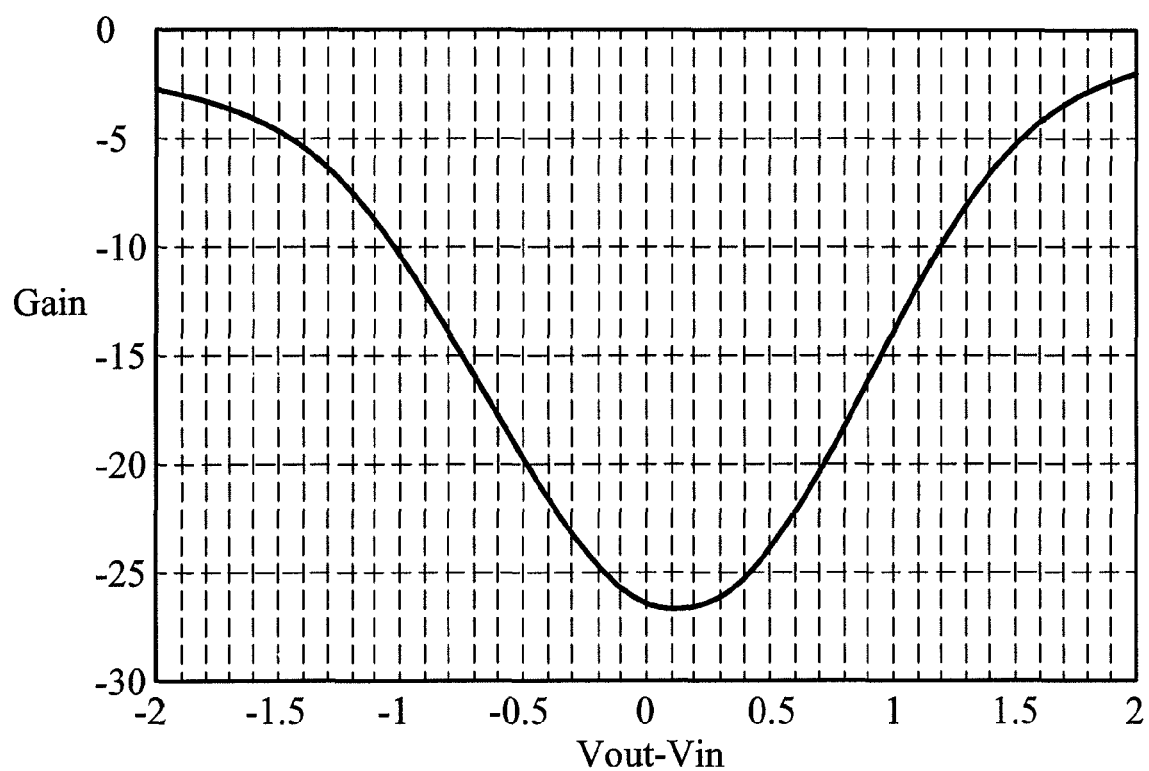
FIG. 5 is a graph used to explain how the operating point of an amplifier influences performance.
Figure 6A:
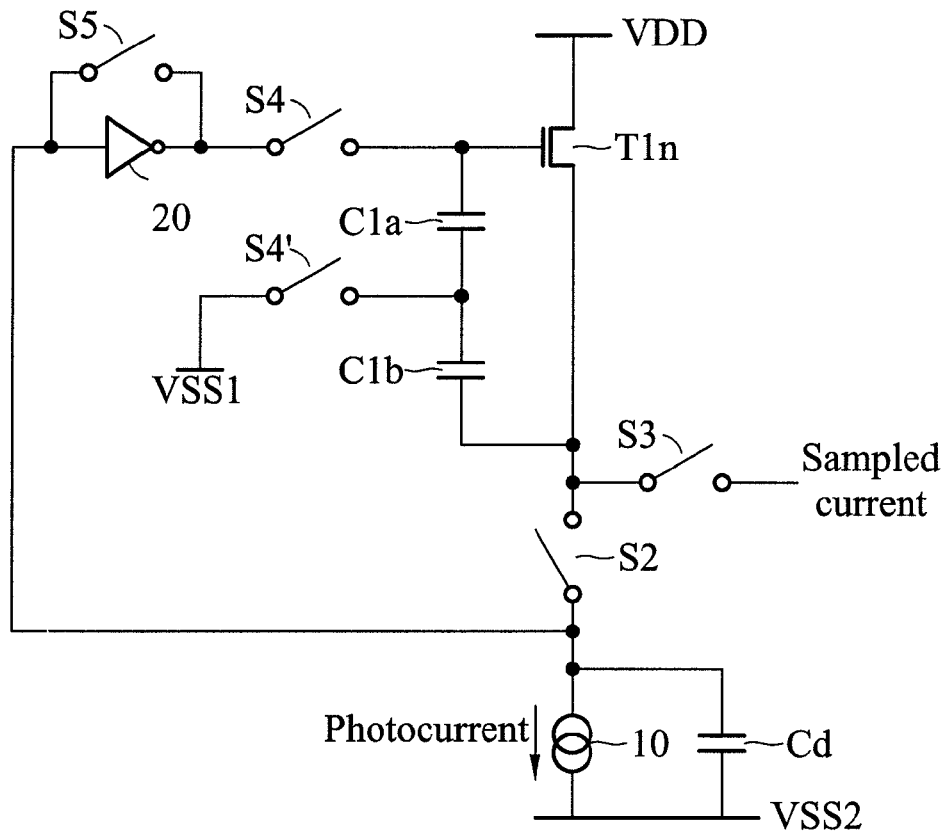
FIG. 6a shows a first example of current sampling circuit of the invention with associated timing diagram.
Figure 6B:
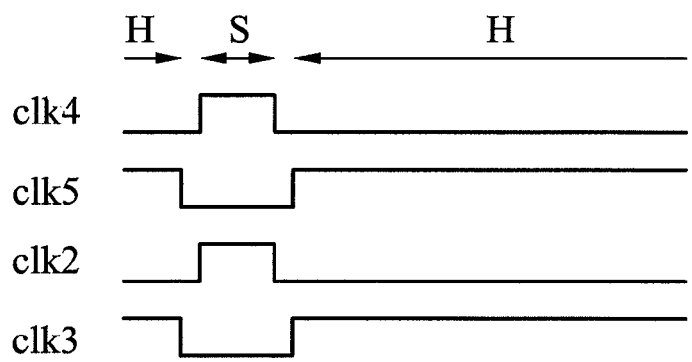

The circuit and associated timing diagram of FIG. 6 addresses the Miller effect issue. In particular, the settling time of the circuit in FIG. 3 can be decreased with the circuit in FIG. 6, in which the capacitance C1 being increased by the Miller effect is split into two capacitors C1a, C1b. The circuit includes a switch S4' for connecting a junction between the first and second capacitors C1a, C1b to a reference potential VSS1. The switch S4' is clocked with the same signal as the switch S4. Thus, during the sampling phase S, with the amplifier connected in a feedback loop, the junction is held at a fixed potential.

In this way, the Miller effect is eliminated and the settling time of the circuit is improved. During the sampling phase, both C1a and C1b have one terminal connected to the fixed potential (e.g. ground) so that C1a is seen as a capacitor driven by the output of the inverting amplifier whereas C1b is seen as the input capacitance of the inverting amplifier.

During the holding phase H, C1a and C1b are connected in series, so that the sum of the voltage stored across C1a and the voltage stored across C1b forms the gate source voltage necessary for T1n to provide the sampled current.

In the circuit in FIG. 6, particular care must be taken for the rate at which the current to be sampled changes. If the current changes very rapidly, the sampled current may go well below the target current and then take time to recover, which will make the circuit intrinsically slow.

Figure 7A:
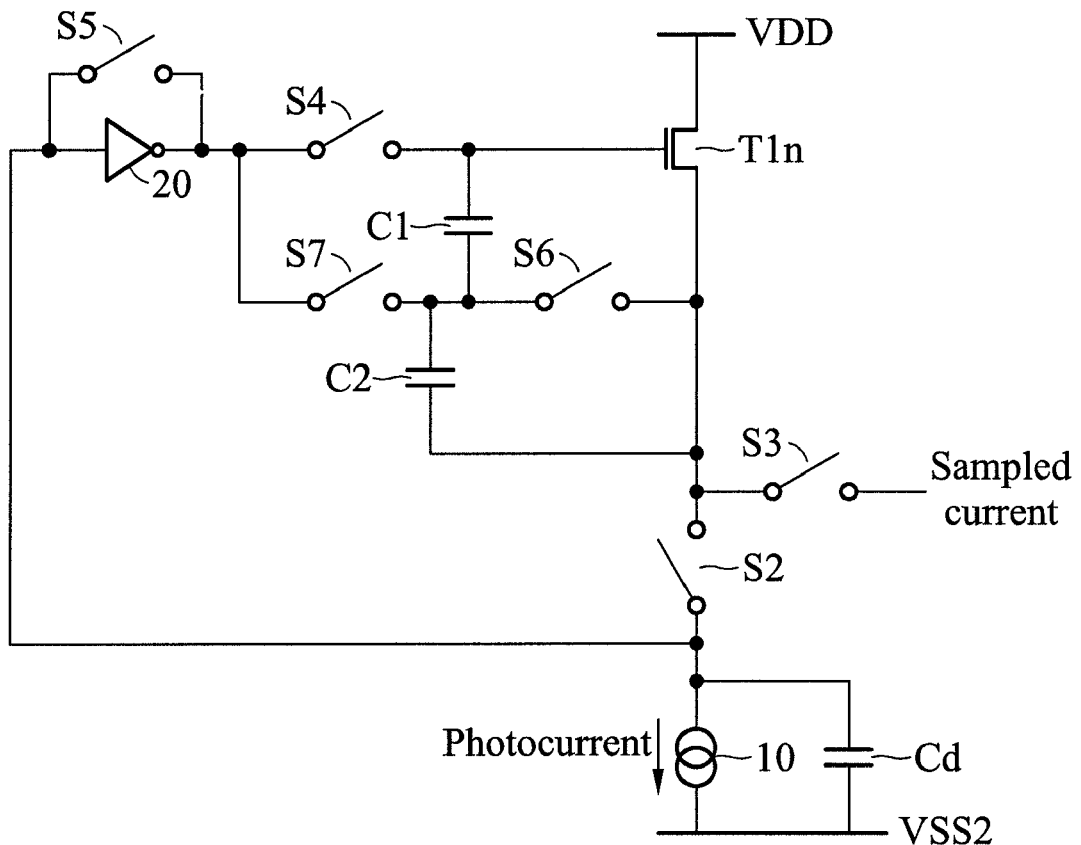
FIG. 7a shows a second example of current sampling circuit of the invention with associated timing diagram.
Figure 7B:
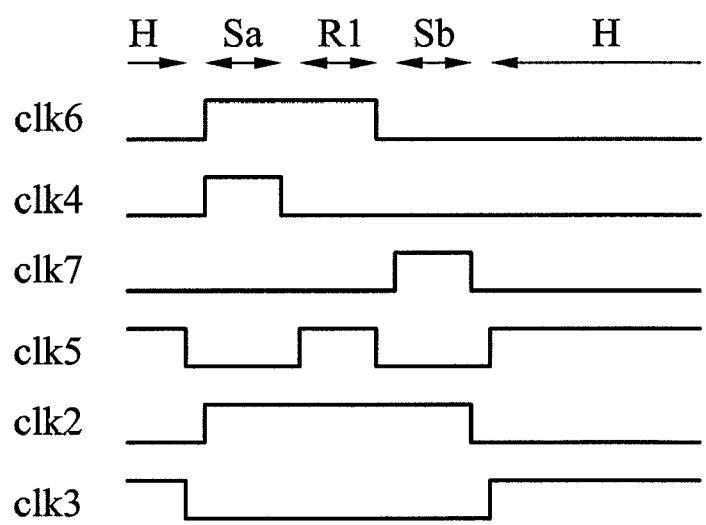

The circuit and associated timing diagram of FIG. 7 addresses the amplifier operating point issue, and implements a double sampling method.

The timeline is divided into a first sampling phase Sa, a reset phase R1, a second sampling phase Sb and a holding phase H.

The circuit has a series capacitor arrangement C1, C2 between the gate and source of the current sampling transistor T1n, for storing the gate-source voltage corresponding to a current being sampled. The circuit is controlled to sample the gate-source voltage corresponding to the current being sampled on to the first capacitor C1 in the first sampling phase Sa, and is controlled to sample the gate-source voltage onto the first and second capacitors in series in the second sampling phase Sb.

The first sampling phase can be considered as a coarse sampling phase, and it is used primarily to set the operating point of the amplifier 20 for the second, fine sampling phase.

A switch S6 (with timing clk6) determines whether the first capacitor C1 is connected between the source and gate of the current sampling transistor (for the first phase), or if the first and second capacitors C1, C2 are connected in series between the source and gate of the current sampling transistor T1n (for the second phase).

The output of the amplifier 20 is connected either to the gate by means of a first amplifier output switch S4 (with timing clk4) for the first phase, or to the junction between the first and second capacitors C1, C2 by means of a second amplifier output switch S7 (with timing clk7) for the second phase. In this way, a voltage on the capacitor C1 is used to define the operating point of the amplifier.

During the first sampling phase Sa, the switches S2, S4 and S6 are closed, while the switches S3, S5, S7 are open. Capacitor C2 is then shorted, while the coarse value of Vgs that T1n needs in order to provide the current to be sampled is built up across C1.

During a reset phase R1, a switch S5 (with timing clk5) is closed. This connects the amplifier input and output together, and the switch S4 is open, so that the amplifier is reset, and not providing a feedback function.

During this reset phase, the inverter amplifier 20 is biased around its threshold, and also the source of T1n is then taken to the amplifier threshold. The gate of T1n will follow this change in the source voltage, since one terminal of the source-gate capacitor C1 is at high impedance. C2 is kept shorted, with the threshold voltage of the inverting amplifier at both its terminals.

During the second sampling phase Sb, the switches S6 and S5 are open, while the switch S7 is closed. The amplifier output is connected to the junction between the capacitors, and both capacitors are between the gate and source of the transistor.

During this phase, the capacitor C1 keeps the coarse gate source voltage value Vgs stored from the first sampling phase Sa, while the correction needed to achieve the correct gate source voltage of T1n is built across C2.

The operating point of the inverting amplifier has thus been shifted towards the high gain region by using the coarse voltage across C1.

The reset phase R1 is needed in order to avoid spikes in the drain current of T1n at the beginning of the second sampling phase Sb. This can happen because, as soon as the switch S7 closes, one terminal of C1 will see the amplified version of the source voltage of T1n, that will get coupled into the gate of T1n through C1, thus causing an initial extra current.

Phase R1 then ensures, through the reset of the inverting amplifier, that the correct voltages are set up at the terminals of C1 and C2.

During the holding phase H, the switches S3 and S5 close, while the switches S2 and S7 open. Capacitors C1 and C2 are then connected in series, so the sum of the voltages across each of them, i.e. the sum of the coarse value and the fine correction, forms the final gate source voltage of T1n necessary to provide the correct sampled current at the output of the circuit.

The double sampling circuit in FIG. 7 is quite independent on the rate at which the current to be sampled changes.

Figure 8A:
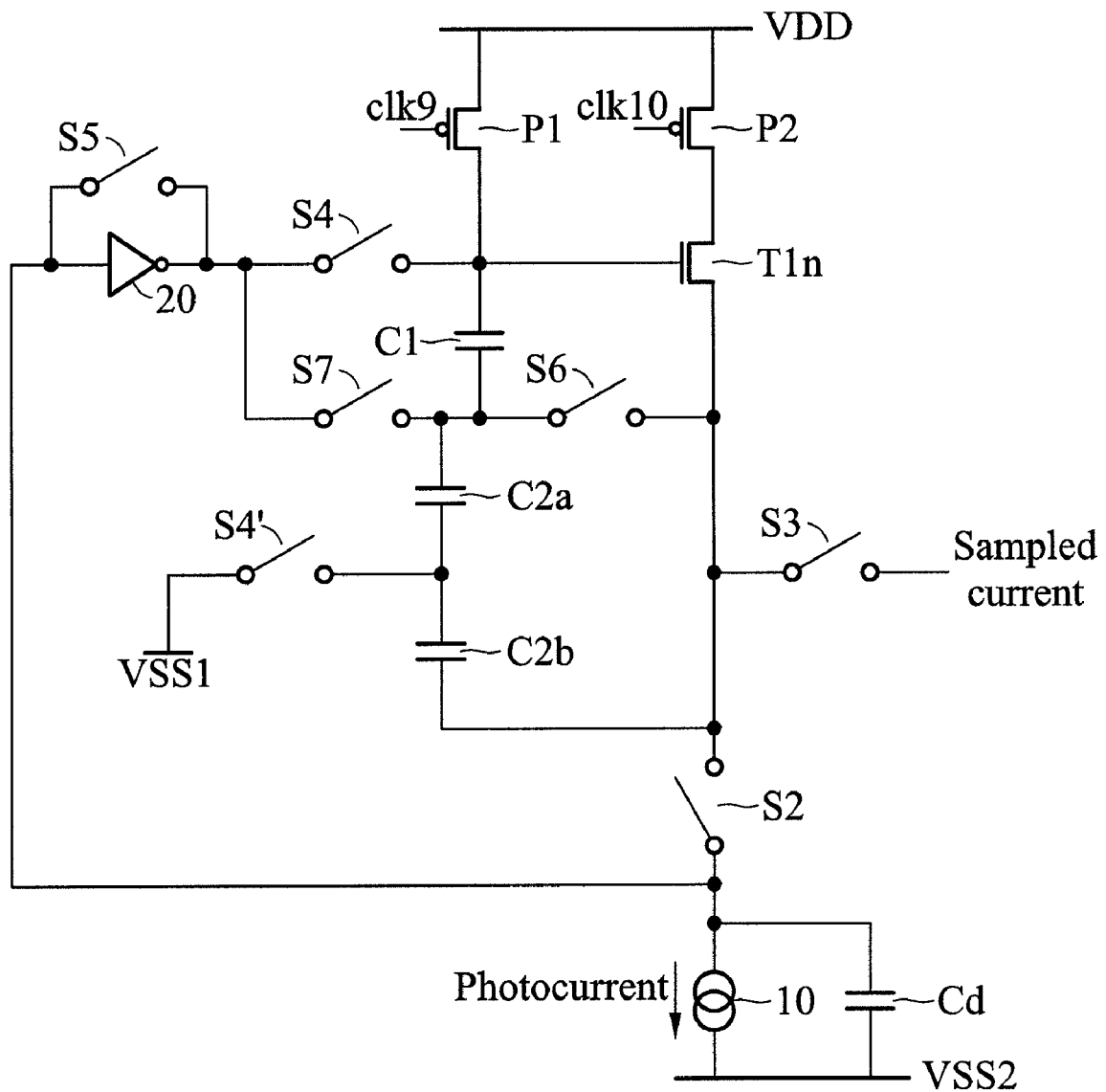
FIG. 8a shows a third example of current sampling circuit of the invention with associated timing diagram.
Figure 8B:
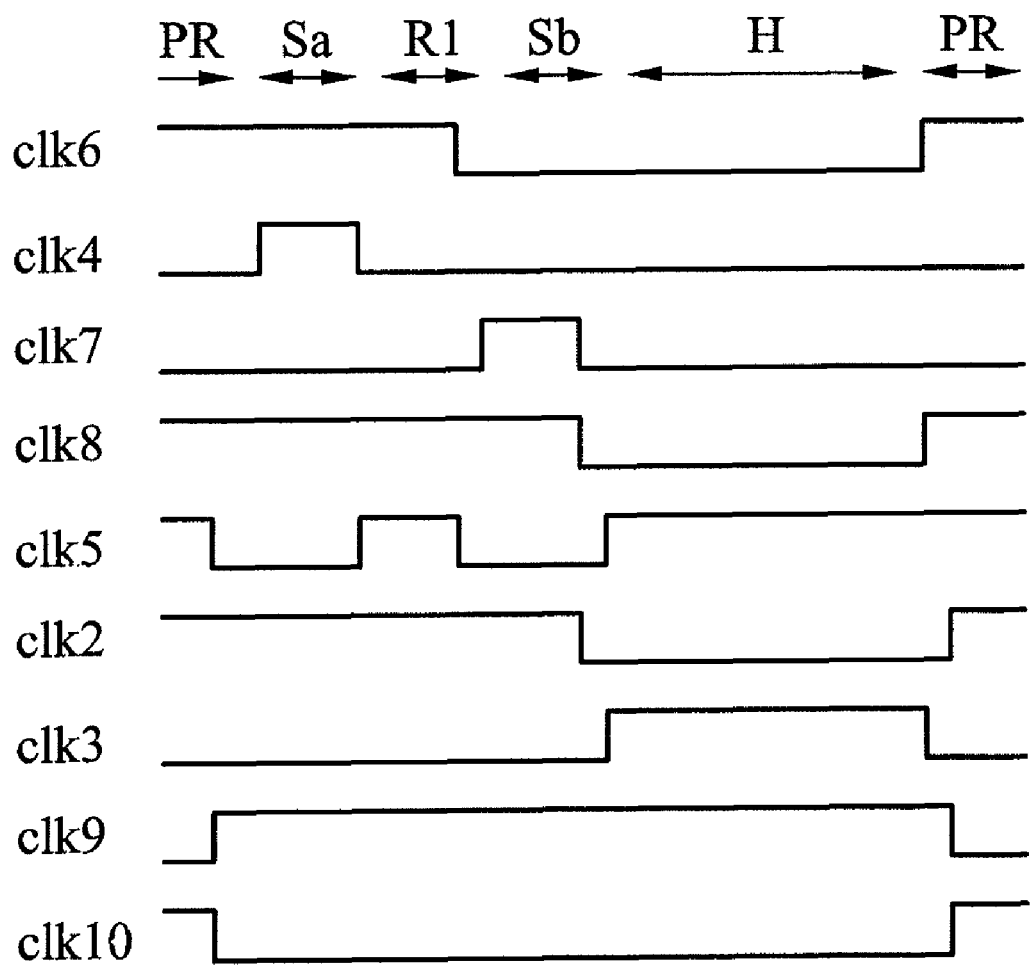

FIG. 8 shows an improved version of the circuit in FIG. 7. In this circuit, the sampling time is decreased even more by splitting the capacitance associated with the Miller effect (C2 in FIG. 7), as explained above in connection with FIG. 6 for the single sampling case.

The circuit of FIG. 8 includes two pre-charge transistors P1, P2. Apart from these, the circuit differs from the circuit of FIG. 7 only in that the capacitor C2 is replaced by two series capacitors C2a, C2b with their junction connected to a fixed potential through a switch s8 (with timing clk8).

The switch S8 is closed during the two sample phases Sa, Sb and the reset phase R1, and then is opened during the holding phase.

In the circuit in FIG. 8, a pre-charge phase is used, by means of the transistors P1, P2.

A first pre-charge transistor P1 is connected between the transistor gate and the high power line VDD and a second pre-charge transistor P2 is connected between the transistor drain and the high power line. These act as switches, controlled by lines clk9 and clk10.

In the pre-charge phase, P1 turns on and P2 turns off and the switches S2, S6, S8 are closed. P1 brings the gate of T1n up to the high voltage rail VDD, and the source of T1n is taken at the threshold of the inverting amplifier biases, so that C1, C2a and C2b have roughly VDD/2 across them.

P2 isolates T1n from VDD so that no extra current flows across T1n. This phase ensures that during the next first sampling phase Sa the initial current through T1n, given by the voltage stored across C1 during the pre-charge time, is high compared to the photocurrent to be sampled. Under this condition, the circuit responds more quickly to the changes in photocurrent, thus giving fast sampling times. During all other phases (Sa, R1, Sb and H), P1 is off and P2 is on so that the connection to the power line VDD is functionally the same as in all the other circuits described.

This circuit is of particular interest in sensor applications, especially when sensing small currents related to e.g. light intensity, temperature or degree of DNA hybridization, that can change in time.

The invention can be used in display devices for processing light sensor signals. Light sensing can be used to control a display automatically in dependence on the ambient light level, and such control schemes are known.

The circuits shown are only some examples. The switches shown in the circuits can of course be implemented with transistors, and if the current sampling circuit is to be integrated onto the substrate of another device (such as a display), the same technology devices will be used for the switches as for the other circuit elements on the substrate. The implementation of the circuits shown will therefore be routine to those skilled in the art.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A current sampling circuit, comprising:
   a current sampling transistor;
   a capacitor arrangement between the gate and source of the current sampling transistor, for storing a gate-source voltage corresponding to a current being sampled;
   an amplifier provided in a feedback loop between the gate and source of the current sampling transistor; and
   a switch arrangement for controlling the circuit to sample a gate-source voltage corresponding to a current being sampled onto the capacitor arrangement,
   wherein the capacitor arrangement comprises a first capacitor circuit for sampling a gate source voltage in a first sampling phase and a second capacitor circuit, with the first and second capacitor circuits being arranged for together sampling the gate source voltage in a second sampling phase,
   and wherein the switch arrangement is operable to shift the operating point of the amplifier between the first and second sampling phases based on the gate source voltage sampled in the first sampling phase.

2. The current sampling circuit as claimed in claim 1, wherein the switch arrangement comprises a switch for selecting if the first capacitor circuit is connected between the source and gate of the current sampling transistor for the first sampling phase, or if the first and second capacitor circuits are connected between the source and gate of the current sampling transistor for the sampling second phase.

3. The current sampling circuit as claimed in claim 1, wherein the switch arrangement comprises a first amplifier output switch for connecting the output of the amplifier to the gate of the current sampling transistor for the first sampling phase and a second amplifier output switch for connecting the output of the amplifier to the junction between the first and second capacitor circuits in the second sampling phase.

4. The current sampling circuit as claimed in claim 1, wherein the switch arrangement is operable to provide a reset phase between the first and second sampling phases in which the amplifier input and output are connected together.

5. The current sampling circuit as claimed in claim 1, wherein the switch arrangement comprises a sampling switch for connecting the current sampling transistor to a source of current, and an output switch for connecting the current sampling transistor to an output of the circuit.

6. The current sampling circuit as claimed in claim 1 wherein one of the first and second capacitor circuits comprises a first and second capacitor in series, wherein the switching arrangement comprises a switch for connecting a junction between the first and second capacitors to a reference potential.

7. A sensor circuit, comprising:
   a current sampling circuit as claimed in claim 1; and
   a sensor having a current output which is the current to be sampled.

8. A current sampling circuit, comprising:
   a current sampling transistor;
   a capacitor arrangement between the gate and source of the current sampling transistor, for storing a gate-source voltage corresponding to a current being sampled;
   an amplifier provided in a feedback loop between the gate and source of the current sampling transistor; and
   a switch arrangement for controlling the circuit to sample a gate-source voltage corresponding to a current being sampled onto the capacitor arrangement,
   wherein the capacitor arrangement comprises a first and second capacitor in series, and wherein the switching arrangement comprises a switch for connecting a junction between the first and second capacitors to a reference potential.

9. A sensor circuit, comprising:
   a current sampling circuit as claimed in claim 8; and
   a sensor having a current output which is the current to be sampled.

10. A current sampling method, comprising:
    in a first sampling phase:
      amplifying a source voltage of a current sampling transistor using an amplifier and providing the amplified voltage to the gate;
      sampling the gate source voltage corresponding to a current being sampled onto a first capacitor circuit; and
      using the sampled gate source voltage to shift the operating point of the amplifier; and
    in a second sampling phase:
      amplifying a source voltage of the current sampling transistor using an amplifier and providing the amplified voltage to the gate; and
      sampling the gate source voltage corresponding to a current being sampled onto a capacitor arrangement comprising the first capacitor circuit and a second capacitor circuit.

11. The method as claimed in claim 10, comprising:
   in the first sampling phase, connecting the first capacitor circuit between the source and gate of the current sampling transistor; and
   in the second sampling phase, connecting the first and second capacitor circuits between the source and gate of the current sampling transistor.

12. The method as claimed in claim 10, comprising:
   in the first sampling phase connecting the output of the amplifier to the gate of the current sampling transistor; and
   in the second sampling phase connecting the output of the amplifier to the junction between the first and second capacitor circuits.

13. The method as claimed in claim 10, further comprising providing a reset phase between the first and second sampling phases in which the amplifier input and output are connected together.

14. The method as claimed in claim 10, comprising connecting the current sampling transistor to a source of current during a sampling phase and to an output of the circuit during a hold phase, wherein one of the first and second capacitor circuits comprises a first and second capacitor in series, and wherein the method further comprises connecting the junction between the first and second capacitors to a reference potential during the sampling phase.

15. A signal sensing method, comprising:
   using a sensor to perform a sensing function, thereby generating a current output; and
   using the method as claimed in claim 10 to sample the current output and provide it at as output.

16. A current sampling method, comprising:
   in a sample phase:
      amplifying a source voltage of a current sampling transistor using an amplifier and providing the amplified voltage to the gate; and
      sampling the gate source voltage corresponding to a current being sampled onto a capacitor circuit which comprises a first and second capacitor in series, wherein during the sampling phase, a junction between the first and second capacitors is connected to a reference potential; and
   in a hold phase:
      providing the sampled current as an output, and isolating the junction between the first and second capacitors from the reference potential.

17. A signal sensing method, comprising:
   using a sensor to perform a sensing function, thereby generating a current output; and
   using the method as claimed in claim 16 to sample the current output and provide it at as output.

* * * * *